United States Patent
Lee et al.

(10) Patent No.: US 9,673,417 B2
(45) Date of Patent: Jun. 6, 2017

(54) ORGANIC LIGHT EMITTING DIODE DISPLAY PANEL AND METHOD OF FABRICATING THE SAME

(71) Applicant: LG DISPLAY CO., LTD., Seoul (KR)

(72) Inventors: DongChin Lee, Seoul (KR); Chul-Hong Kim, Goyang-si (KR); Sunghee Cho, Seoul (KR); Yongbin Jeong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/879,895

(22) Filed: Oct. 9, 2015

(65) Prior Publication Data

US 2016/0104867 A1    Apr. 14, 2016

(30) Foreign Application Priority Data

Oct. 13, 2014    (KR) .................. 10-2014-0137778

(51) Int. Cl.
*H01L 51/52* (2006.01)
*H01L 27/32* (2006.01)

(52) U.S. Cl.
CPC ...... *H01L 51/5215* (2013.01); *H01L 51/5234* (2013.01); *H01L 51/5253* (2013.01); *H01L 27/3244* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 2011/0269629 A1* | 11/2011 | Giustino | B82Y 30/00 505/100 |
| 2013/0048943 A1 | 2/2013 | Lee et al. | |
| 2014/0017444 A1* | 1/2014 | Shimizu | G02F 1/13439 428/131 |
| 2014/0184948 A1 | 7/2014 | Park et al. | |
| 2014/0295179 A1* | 10/2014 | Naito | B82Y 10/00 428/339 |
| 2016/0020420 A1* | 1/2016 | Lee | H01L 51/102 136/256 |
| 2016/0027935 A1* | 1/2016 | Naito | H01L 31/02242 438/98 |
| 2016/0043152 A1* | 2/2016 | Tian | H01L 29/78696 257/27 |

(Continued)

FOREIGN PATENT DOCUMENTS

CN    104091892 A    10/2014

OTHER PUBLICATIONS

Despiau-Pujo, Emilie, Alexandra Davydova, Gilles Cunge, and David Graves B. "Hydrogen Plasmas Processing of Graphene Surfaces." Plasma Chemistry and Plasma Processing Plasma Chem Plasma Process 36.1 (2015): 213-29.*

(Continued)

*Primary Examiner* — Joseph Schoenholtz
(74) *Attorney, Agent, or Firm* — Birch, Stewart, Kolasch & Birch, LLP

(57) ABSTRACT

An organic light-emitting diode (OLED) display panel includes an organic layer positioned on a first electrode and a multilayer thin film positioned on the organic layer. The multilayer thin film is formed of a stack of graphene. The multilayer thin film has an interlayer bonding between two or more upper layers thereof.

16 Claims, 18 Drawing Sheets

(56) References Cited

U.S. PATENT DOCUMENTS

2016/0043343 A1* 2/2016 Zhang ................ H01L 51/5212
                                                         257/40
2016/0168726 A1* 6/2016 Dryfe ...................... C01B 31/04
                                                        205/615
2016/0207291 A1* 7/2016 Dimitrakopoulos .... B32B 18/00

OTHER PUBLICATIONS

Elias, D. C., R. Nair R., T. Mohiuddin M. G., S. Morozov V., P. Blake, M. Halsall P., A. Ferrari C., D. Boukhvalov W., M. Katsnelson I., A. Geim K., and K. Novoselov S. "Control of Graphene's Properties by Reversible Hydrogenation: Evidence for Graphane." Science 323.5914 (2009): 610-13.*

Eren, Baran, Dorothée Hug, Laurent Marot, Remy Pawlak, Marcin Kisiel, Roland Steiner, Dominik Zumbahl M., and Ernst Meyer. "Pure Hydrogen Low-temperature Plasma Exposure of HOPG and Graphene: Graphane Formation?" Beilstein J. Nanotechnol. Beilstein Journal of Nanotechnology 3 (2012): 852-59.*

Jo, Gunho, Minhyeok Choe, Sangchul Lee, Woojin Park, Yung Kahng Ho, and Takhee Lee. "The Application of Graphene as Electrodes in Electrical and Optical Devices." Nanotechnology 23.11 (2012): 112001.*

Cao, Weiran, Jian Li, Hongzheng Chen, and Jiangeng Xue. "Transparent Electrodes for Organic Optoelectronic Devices: A Review." Journal of Photonics for Energy J. Photon. Energy 4.1 (2014): 040990.*

Zhu, Shou-En, Shengjun Yuan, and G. Janssen C. A. M. "Optical Transmittance of Multilayer Graphene." EPL EPL (Europhysics Letters) 108.1 (2014): 17007.*

* cited by examiner

ORGANIC LIGHT EMITTING DIODE DISPLAY PANEL AND METHOD OF FABRICATING THE SAME

CROSS REFERENCE TO RELATED APPLICATION

This application claims priority from and the benefit under 35 U.S.C. §119(a) of Korean Patent Application Number 10-2014-0137778 filed on Oct. 13, 2014, which is hereby incorporated by reference for all purposes as if fully set forth herein.

BACKGROUND OF THE INVENTION

Field of the Invention

The present disclosure relates to an organic light-emitting diode (OLED) display panel and a method of fabricating the same.

Description of Related Art

In the flat panel display industry, liquid crystal display (LCD) devices have been widely used since they are light and consume less power. However, LCD devices have limited abilities in terms of brightness, contrast ratio, viewing angles, size, and the like, since they are non-emissive devices that do not emit light by themselves.

In order to overcome these problems of LCD devices, new flat display devices have been actively developed. Organic light-emitting diode (OLED) display devices, one type of new flat display devices, have advantages of high luminance levels, wide viewing angles, and high contrast ratios compared to LCD devices, since OLEDs able to emit light by themselves are used therein. In addition, OLED display devices can have a light and thin profile and consume less power, since they do not require a backlight.

An OLED display panel of an OLED display device displays an image using light emitted from OLEDs connected to thin-film transistors (TFTs) in each pixel area. OLEDs are a device in which an organic compound forms an organic light-emitting layer between the anode and the cathode to emit light when an electric field is applied thereto. OLEDs have many advantages such as operability at low voltages, relatively low power consumption, a low weight, and fabricability on a flexible substrate.

OLEDs are grouped into a top emission (or front emission) type and a bottom emission (or back emission) type. Top emission OLEDs require high levels of light transmittance and high electrical conductivity for a cathode. However, the use of a transparent material for the cathode has an adverse effect on electrical conductivity characteristics due to the high sheet resistance, whereas the addition of a metal layer intended to improve electrical conductivity reduces light transmittance instead.

A protective layer protecting the internal devices of an OLED display device has limited impermeability properties when it is formed of a single layer or a thin film, and therefore cannot effectively protect the interior from moisture and oxygen. In contrast, when a multilayer structure is employed to improve the permeability of the protective layer, it is problematic in that light transmittance is reduced, processing is complicated, the number of process steps is increased, and consequently manufacturing costs are increased.

In addition, when OLED display devices are flexible display devices, it is difficult to ensure that the layers have mechanical flexibility when forming layers by vapor deposition.

SUMMARY OF THE INVENTION

Aspects of an invention are set out in the independent claims. Various embodiments of the present invention provide an organic light-emitting diode (OLED) display panel, a method of fabricating the same, and an OLED display device that has superior light transmittance, sheet resistance, electrical conductivity, mechanical flexibility, and reliability, as well as a reduced number of process steps and reduced time for the processing.

In an embodiment, there is provided an organic light-emitting diode display panel including: an organic layer positioned on a first electrode; and a multilayer thin film positioned on the organic layer, the multilayer thin film being formed of a stack of graphene. The multilayer thin film has interlayer bonding between two or more upper layers thereof.

In another embodiment, there is provided a method of fabricating an organic light-emitting diode display panel including: forming an organic layer on a first electrode; forming a multilayer thin film formed of graphene on the organic layer; and forming interlayer bonding between two or more upper layers of the multilayer thin film by plasma treatment, whereby layers without the interlayer bonding form a second electrode, and two or more layers having the interlayer bonding form an encapsulation layer.

As set forth above, the OLED display panel, the method of fabricating the same, and the OLED display device according to the present disclosure have superior light transmittance, sheet resistance, electrical conductivity, mechanical flexibility, and reliability characteristics, as well as advantageous effects, such as the reduced number of process steps and the reduced time required for processing.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION OF THE EMBODIMENTS

Figure 1:
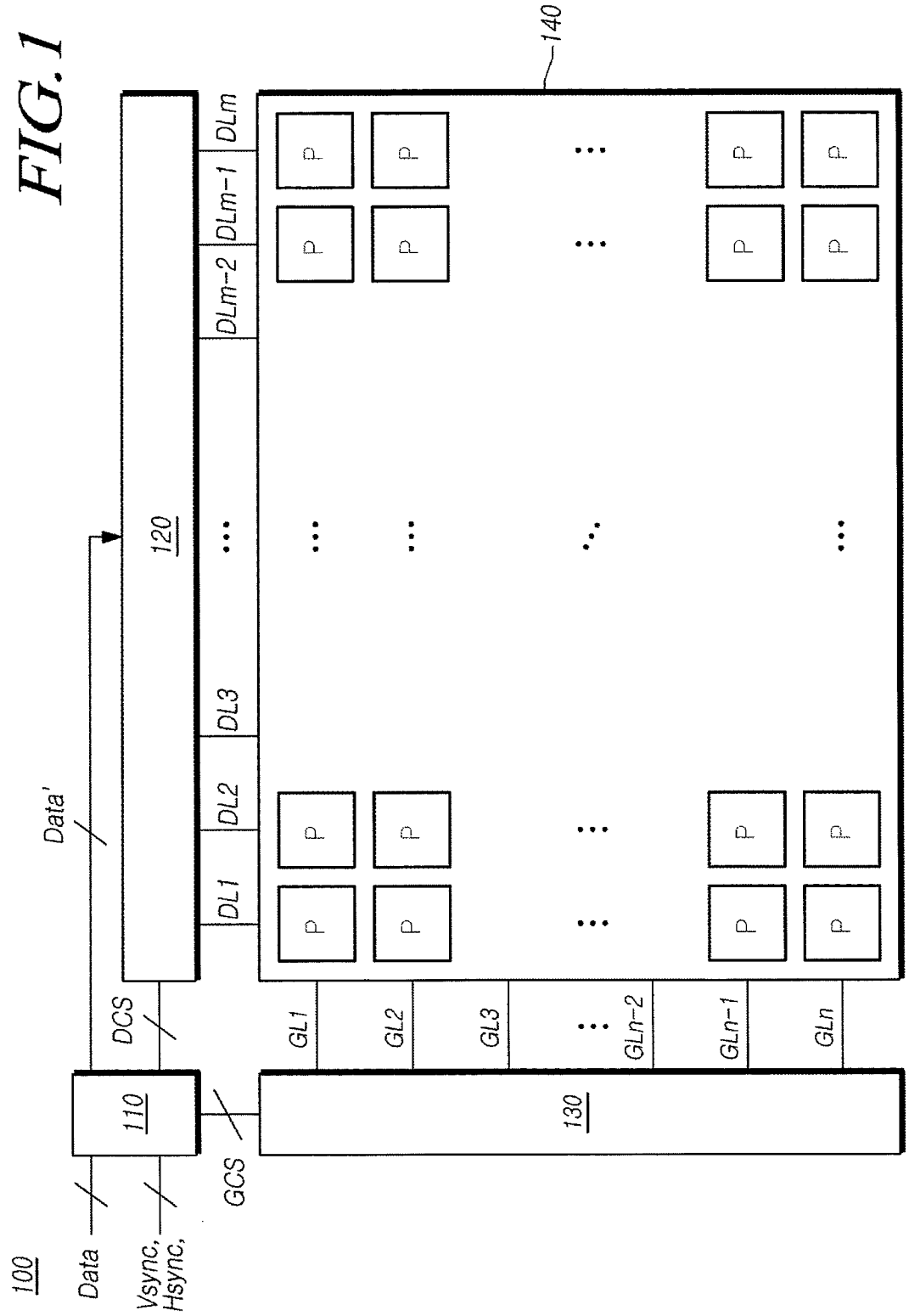
FIG. 1 is a schematic system configuration view illustrating an OLED display device to which embodiments are applied.

Reference will now be made in detail to the present disclosure, embodiments of which are illustrated in the accompanying drawings. Throughout this document, reference should be made to the drawings, in which the same reference numerals and signs may be used throughout the different drawings to designate the same or similar components. In the following description of the present disclosure, detailed descriptions of known functions and components incorporated herein will be omitted in the case that the subject matter of the present disclosure may be rendered unclear thereby.

It will also be understood that, although terms such as "first," "second," "A," "B," "(a)" and "(b)" may be used herein to describe various elements, such terms are only used to distinguish one element from another element. The substance, sequence, order or number of these elements is not limited by these terms. It will be understood that when an element is referred to as being "connected to" or "coupled to" another element, not only can it be "directly connected" or "coupled to" the other element, but also can it be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

FIG. 1 is a schematic system configuration view illustrating an organic light-emitting diode (OLED) display device 100 to which embodiments of the present disclosure are applied.

Referring to FIG. 1, the OLED display device 100 includes a display panel on which m number of data lines DL1, DL2, . . . , and DLm (where m is a natural number) and n number of gate lines GL1, GL2, . . . , and GLn (where n is a natural number) are formed; a data driver 120 driving the m number of data lines DL1 to DLm; a gate driver 130 sequentially driving the n number of gate lines GL1 to GLn; and a timing controller 110 controlling the data driver 120 and the gate driver 130.

First, the timing controller 110 outputs a data control signal DCS to control the data driver 120 and a gate control signal GCS to control the gate driver 130 based on external timing signals input from a host computer, such as vertical/horizontal synchronization signals Vsync and Hsync, image data, and clock signals. In addition, the timing controller 110 converts image data input from the host computer to the format of a data signal used in the data driver 120, and supplies converted image data Data' to the data driver 120.

In response to the data control signal and the converted image data Data' input from the timing controller 110, the data driver 120 converts the image data Data' to a data signal, i.e. a voltage value corresponding to a grayscale level (an analog pixel signal or a data voltage), and supplies the converted data signal to the data lines DL1 to DLm.

In addition, in response to the gate control signal GCS input from the timing controller 110, the gate driver 130 sequentially supplies a scanning signal (a gate pulse, scanning pulse or gate on signal) to the gate lines GL1 to GLn.

The gate driver 130 is positioned on one side of the display panel 110 as in FIG. 1, or according to a driving scheme, may be divided into two sections positioned on opposite sides of the display panel 140.

Pixels P on the OLED display panel 140 may be arranged in the shape of a matrix, positioned on areas defined by the data lines DL1 to DLm and the gate lines GL1 to GLn.

The OLED display device 100 includes a first electrode (not shown) acting as an anode (not shown), an organic layer (not shown) positioned on the first electrode (not shown), and a graphene-stacked multilayer thin film (not shown) positioned on the organic layer (not shown). Interlayer bonding (not shown) is present between two or more upper layers of the multilayer thin film (not shown). The interlayer bonding (not shown) is an $sp^3$ bond (not shown) of carbon atoms of adjacent two layers. Herein, the $sp^3$ bond (not shown) may be interpreted as being a diamond-like structure (not shown).

In the OLED display device 100, the two or more layers present in the interlayer structure (not shown) are an encapsulation layer (not shown), and the layers without the interlayer bonding may be a common electrode that acts as both a cathode (not shown) and a second electrode (not shown).

Hereinafter, the first electrode, the anode, and a positive electrode may be used as to mean the same thing.

As described above, the OLED display device 100 according to embodiments of the present disclosure has the interlayer bonding formed in the multilayer thin film of graphene by plasma treatment. Layers having the interlayer bonding act as an encapsulation layer that protects the organic layer and the device, and the layers without the interlayer bonding act as the second electrode. Accordingly, due to the omission of the traditional upper substrate, the thickness is reduced, processing is simplified, characteristics such as moisture impermeability, electrical conductivity, and light transmittance are significantly improved, and mechanical flexibility due to the physical properties of graphene is obtained.

Detailed descriptions of embodiments will be given below with reference to the drawings.

Figure 2:
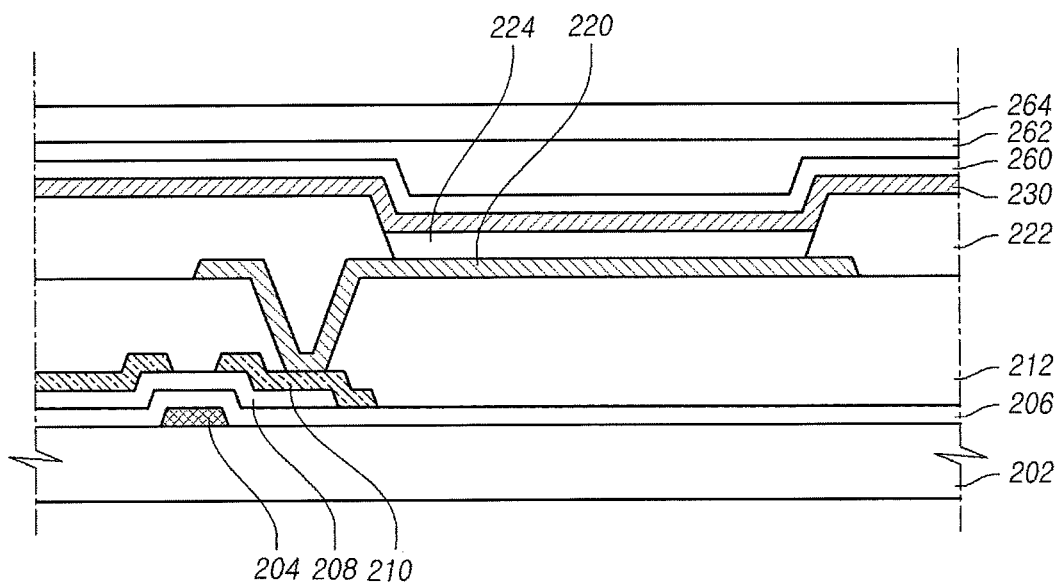
FIG. 2 is a schematic cross-sectional view illustrating a general OLED display panel.

FIG. 2 is a schematic cross-sectional view illustrating a general OLED display panel.

Referring to FIG. 2, the OLED display panel 140 includes: a substrate 202; a transistor positioned on the substrate 202, the transistor including a gate electrode 204, a gate insulation film 206, a semiconductor layer 208, and a source electrode/drain electrode 210; and a planarization layer 212 positioned on the transistor. The OLED display panel 140 also includes a first electrode 220 positioned on the planarization layer 202 and connected to the source electrode/drain electrode 210 via a contact hole, a bank 222 overlapping the circumference of the first electrode 220 to expose a portion of the first electrode 220, an organic layer 224 positioned on the exposed first electrode 220, and a second electrode (or a common electrode) 230 formed on the entire surface covering the organic layer 224 and the bank 222. In addition, the OLED display panel 140 includes a passivation layer 260 protecting the devices inside the OLED display panel 140, such as the organic layer 224, and an encapsulation layer 264 bonded to the passivation layer 260 via a bonding layer 262.

When the OLED display panel 140 is a top emission type, the second electrode 230 must have a high level of light transmittance. However, a transparent metal oxide, such as indium tin oxide (ITO), fails to realize sufficient electrical conductivity, which is problematic. For this reason, the second electrode 230 is formed as a transparent metal oxide layer and a metal layer intended to obtain electrical conductivity. Here, the metal intended to obtain electrical conductivity is an alloy such as MgAg, which disadvantageously reduces light transmittance.

In addition, the OLED display panel 140 also includes the passivation layer 260, the bonding layer 262, and the encapsulation layer 264 that are sequentially stacked on the second electrode 230. All of these layers are protective layers to protect the organic layer 224 from moisture or oxygen, in which the passivation layer 260 may have a multilayer structure including an organic film and an inorganic film. In this case, there are problems in that the number of process steps is increased, and manufacturing costs are increased because of the deposition process or the like.

When the OLED display panel 140 is a flexible OLED display panel 140, the passivation layer 260, the bonding layer 262, the encapsulation layer 264, and the like are formed of inorganic materials. In this case, however, reduced mechanical flexibility lowers the reliability of products, and cracks cause poor image quality. In addition, when the protective layer is formed of a single layer or a small number of layers in order to obtain flexibility, it is impossible to prevent oxygen or moisture from permeating through the protective layer due to reduced moisture impermeability.

Embodiments of the present disclosure are configured to overcome the above-discussed problems using the multilayer structure positioned on the organic layer 224. Detailed descriptions of the embodiments will be given below with reference to the drawings.

Figure 3:
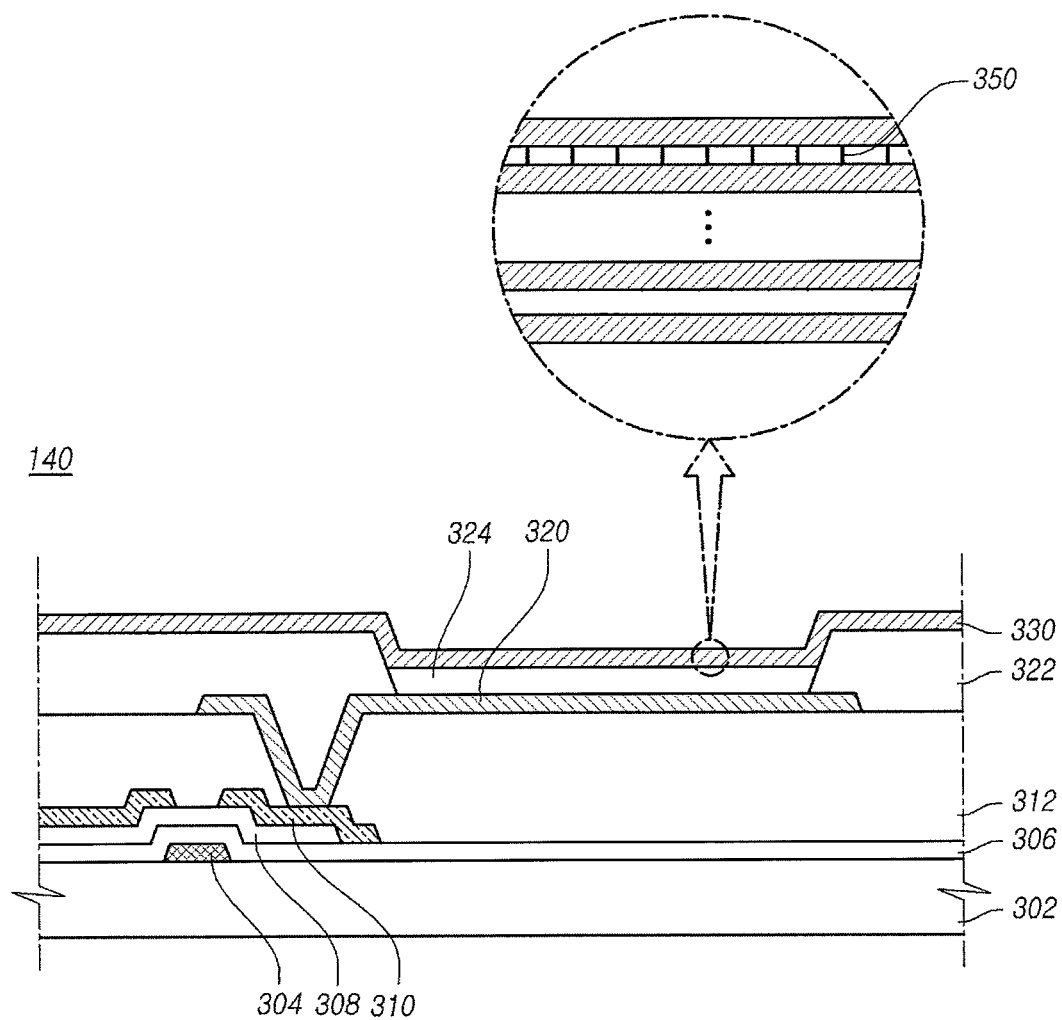
FIG. 3 is a cross-sectional view illustrating an OLED display panel according to an exemplary embodiment of the present disclosure.

FIG. 3 is a cross-sectional view illustrating an OLED display panel according to an exemplary embodiment of the present disclosure.

Referring to FIG. 3, the OLED display panel 140 includes: a substrate 302; a transistor positioned on the substrate 302, the transistor including a gate electrode 304, a gate insulation film 306, a semiconductor layer 308, and a source electrode/trench electrode 310; and a planarization layer 312 positioned on the transistor. The OLED display panel 140 also includes a first electrode 320 positioned on the planarization layer 312 and connected to the source electrode/drain electrode 310 via a contact hole, and a bank 322 overlapping the circumference of the first electrode 320 to expose a portion of the first electrode 320.

The OLED display panel 140 according to this embodiment includes an organic layer 324 positioned on the first electrode 320 and a graphene-stacked multilayer thin film 330 positioned on the organic layer 324, in which interlayer bonding 350 is present between two or more upper layers of the multilayer thin film 330.

The interlayer bonding 350 is an $sp^3$ bond of carbon atoms of two adjacent layers. The $sp^3$ bond indicates a structure in which a carbon atom forms four bonds with the surrounding four atoms. In other words, the $sp^3$ bond indicates a bonding structure in which the coordination number of carbon is 4. Since diamond has an $sp^3$ bond unlike the planar structure of graphite, the $sp^3$ bond is interpreted as being a diamond-like structure.

First, the substrate 302 may be implemented as not only a glass substrate, but also a plastic substrate, such as a polyethylene terephthalate substrate, a polyethylene naphthalate substrate, or a polyimide substrate.

The substrate 302 may be provided with a buffer layer that prevents impurities from penetrating into the substrate. The buffer layer may be a single layer or a multilayer of, for example, silicon nitride (SiNx) or silicon oxide (SiOx).

The gate electrode 304 has the function of transferring gate signals to transistors, and may be implemented as a single layer or a multilayer formed of at least one metal or alloy, such as Al, Pt, Pd, Ag, Mg, Au, Ni, Nd, Ir, Cr, Li, Ca, Mo, Ti, W, and Cu. In addition, the source electrode/drain electrode 310 electrically connected to the semiconductor layer 308 may be formed of a refractory metal, such as Cr or Ta.

The semiconductor layer 308 may be formed of a metal oxide selected from among, but is not limited to, indium gallium zinc oxide (IGZO), zinc tin oxide (ZTO), or zinc indium oxide (ZIO). Rather, the semiconductor layer 308 may be formed of amorphous silicon (a-Si) or polysilicon.

The gate insulation film 306 may be formed of an inorganic insulation material, such as SiOx or SiNx.

The transistor including the gate electrode 304, the semiconductor layer 308, the source electrode/drain electrode 310 is illustrated as being, for example, a bottom gate type. However, the present disclosure is not limited thereto, and the transistor may be a top gate type.

The planarization layer 312 is a hydrophobic organic or inorganic film, considering mechanical strength, anti-moisture permeability, ease of film formation, and the like. For example, the planarization layer 312 is formed of one selected from among, but is not limited to, polystyrene, siloxane series resin, acrylic resin, SiON, SiNx, SiOx, and AlOx.

The first electrode 320 formed on the planarization layer 312 may be formed of a transparent conductive material having a relatively large work function to act as an anode electrode. For example, the first electrode 320 may be formed of one selected from among, but not limited to: a metal oxide, such as indium tin oxide (ITO) or indium zinc oxide (IZO); a metal-oxide mixture, such as ZnO:Al or SnO2:Sb; carbon nanotube; graphene; and silver nanowire.

In addition, in the case of top emission type, a reflector formed of a metal material having superior reflectance, for example Al or Ag, may be disposed as an auxiliary electrode on or underlying the first electrode 320 in order to improve reflectance.

Herein, the term "top emission" refers to light emission from the organic layer 324 in the direction toward the multilayer thin film 330, whereas the term "bottom emission" refers to light emission in the opposite direction from the "top emission."

The bank 322 defines a light-emitting area, and may be formed of a hydrophobic organic material, for example, polystyrene, polymethylmethacrylate (PMMA), benzocyclobutene series resin, siloxane series resin, silane resin, acrylic resin, or the like.

The organic layer 324 may be formed of a multilayer sequentially stacked from the top surface of the pixel electrode 320. For example, the organic layer 324 may have a five-layer structure including a hole injection layer, a hole transport layer, an emitting layer, an electron transport layer, and an electron injection layer; a four-layer structure including a hole transport layer, an emitting layer, an electron transport layer, and an electron injection layer; or a three-layer structure including a hole transport layer, an emitting layer, and an electron transport layer.

In the OLED display panel 140 according to this embodiment, the two or more layers of the multilayer thin film 330 having the above-stated interlayer bonding 350 present between them are an encapsulation layer, and the layers without the interlayer bonding 350 are a second electrode (or a common electrode).

That is, the multilayer thin film 330 is a single structure that simultaneously performs the function of protecting the internal devices and the function of serving as the second electrode.

Each layer of the multilayer thin film is formed of graphene, i.e. a two-dimensional material formed of carbon atoms having a honeycomb structure.

The multilayer thin film 330 may be grown on a rapid catalyst by chemical vapor deposition, but the present disclosure is not limited thereto. Rather, the multilayer thin film 330 may be formed of reduced graphene oxide (rGO) that is produced by forming graphene oxide (GO) by oxidizing graphene with a strong oxidizer such as potassium permanganate ($KMnO_4$) and subsequently reducing the graphene oxide (GO) with a reducer such as hydrazine ($NH_2NH_2$).

Graphene has superior mechanical properties, high chemical resistance, high mechanical flexibility, superior thermal resistance, high charge carrier mobility, and high charge storage capacity, since it is formed of two-dimensionally conjugated $sp^2$ hybrid carbons.

Accordingly, the portion of the multilayer thin film 330 corresponding to the second electrode has higher levels of light transmittance and electrical conductivity, a lower level of sheet resistance, and a higher level of flexibility compared to those of the typical second electrode of the OLED display panel 140.

In contrast, the portion of the multilayer thin film 330 corresponding to the encapsulation layer has insulating characteristics, due to a plasma treatment, as well as a low level of electrical conductivity and superior moisture impermeability. Here, the plasma may be, for example, hydrogen plasma.

In addition, since the single structure realizes the above-stated two functions that would otherwise be realized by two structures in the related art, the time required for processing is reduced, the number of process steps is reduced, and consequently manufacturing costs are reduced.

These characteristics are caused by the interlayer bonding 350 produced by the plasma treatment. The interlayer bonding 350 may be formed between the two or more layers positioned in the upper part of the multilayer thin film 330.

The multilayer thin film 330 and the interlayer bonding 350 will be described in greater detail with reference to FIG. 4.

Figure 4:
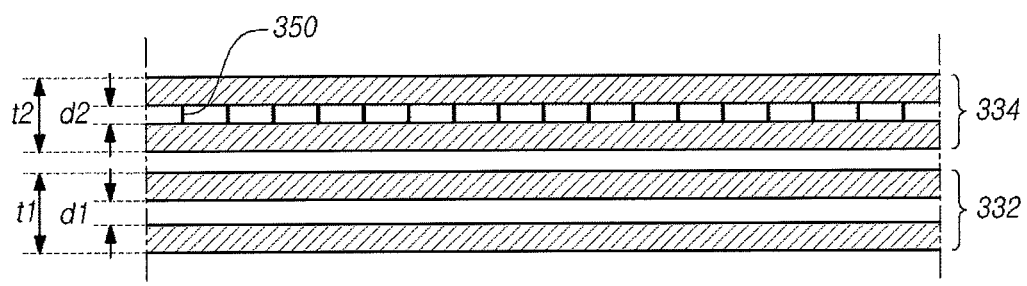
FIG. 4 is a schematic cross-sectional view illustrating an implementation of a multilayer thin film of an OLED display device according to another exemplary embodiment of the present disclosure.

FIG. 4 is a schematic cross-sectional view illustrating an implementation of a multilayer thin film of an OLED display device according to another exemplary embodiment of the present disclosure.

Referring to FIG. 4, the graphene-stacked multilayer thin film 330 is positioned on the organic layer 324 (see FIG. 3). The multilayer thin film 330 has the interlayer bonding 350 present between two or more upper layers thereof.

The interlayer bonding 350 refers to an $sp^3$ bond (not shown) of carbon atoms of adjacent two layers or a diamond-like structure. Carbon atoms present on the same layer as the interlayer bonding 350 present are locally or entirely combined with four-surrounding atoms.

Graphene without plasma treatment has a coordination number 3, and forms sigma ($\sigma$) bonds with surrounding carbons. In addition, pi ($\pi$) bonds (conjugates) are formed between electrons that do not participate in the sigma ($\sigma$) bonds.

When the multilayer thin film 330 formed of graphene is treated with hydrogen plasma, the $sp^2$ network formed of pi ($\pi$) bonds on the upper layers of the multilayer thin film 330 is destroyed when exposed to the plasma, whereby sigma ($\sigma$) bonds may be formed. This change may occur locally on each layer or occur for the entire upper layers.

This change causes the two or more layers having the interlayer bonding 350 to form encapsulation layers 334 and the layers 332 without the interlayer bonding 350 to act as the second electrode layers 332.

When an $sp^3$ bond is formed by carbon atoms of adjacent layers, the interlayer distance between the adjacent layers is reduced, and there are changes in electrical conductivity, sheet resistance, and moisture permeability.

Specifically, the interlayer distance d2 of the two or more layers 334 having the interlayer bonding 350 may be smaller than the interlayer distance d1 of the layers 332 without the interlayer bonding 350. This is due to the relatively-strong bonding force between the adjacent layers caused by the $sp^3$ bond formed by carbon atoms of adjacent layers.

In other words, the interlayer distances d1 and d2 may differ since the two or more layers 334 having the interlayer bonding 350 are bonded by a covalent bond and the layers 332 without the interlayer bonding 350 interact by Van der Waals force. Specifically, the two or more layers 334 having the interlayer bonding 350 are combined by a sigma ($\sigma$) bond, i.e. a covalent bond between atoms. The layers 332 without the interlayer bonding 350 are not directly bonded, and the interlayer distance d1 is maintained by Van der Waals interactions caused by instantaneously induced charge.

In addition, the sheet resistance of the two or more layers 334 having the interlayer bonding 350 is greater than the sheet resistance of the layers 332 without the interlayer bonding 350. The upper layers having the interlayer bonding 350 have insulating characteristics due to the hydrogen plasma treatment.

In contrast, the layers 332 without the interlayer bonding 350 have a high level of electrical conductivity and a low level of sheet resistance due to the physical properties of graphene. For example, the layers 332 without the interlayer bonding 350 may have a high level of electrical conductivity since the sheet resistance thereof may be smaller than $1\Omega/\square$ (Ohms per square).

That is, the electrical conductivity of the two or more layers 334 having the interlayer bonding 350 is smaller than the electrical conductivity of the layers 332 without the interlayer bonding 350.

An increase in the number of the layers 332 without the interlayer bonding 350 increases the thickness, lowers the sheet resistance, and increases the electrical conductivity of the layers 332 without the interlayer bonding 350. Thus, an increase in the thickness of the layers 332 without the interlayer bonding 350 increases the brightness of light that the OLED display panel 140 emits in response to a drive voltage equally applied thereto. In other words, the sheet resistance of the layers 332 without the interlayer bonding 350 decreases as the entire thickness thereof increases. Consequently, when the same drive voltage is applied, a greater amount of current flows from the first electrode 320 to the second electrode 330, thereby increasing the brightness of the OLED display panel 140.

The moisture permeability of the two or more layers 334 having the interlayer bonding 350 may be smaller than the moisture permeability of the layers 332 without the interlayer bonding 350. This is because the interlayer bonding 350 itself, or the reduction in interlayer distance due to the interlayer bonding 350, prevents external moisture or oxygen from permeating. Therefore, the moisture permeability of the encapsulation layers 334 may be, for example, $10^{-4}$ g/m²·day or less. A detailed description of the moisture permeability will be given below with reference to FIG. 8A and FIG. 8B.

The layers 334 having the interlayer bonding 350 act as the encapsulation layer 334 since they have high sheet resistance and low electrical conductivity characteristics. The layers 332 without the interlayer bonding 350 act as the second electrode layer 332 since they have low sheet resistance and high electrical conductivity characteristics.

For the OLED display panel 140 according to this embodiment, the number of process steps is reduced, the time required for processing is reduced, and consequently manufacturing costs are reduced compared to typical panels.

In the typical OLED display panel 140 as described above, the second electrode layer 332 is positioned on the organic layer 324, and the passivation layer 260, the bonding layer 262, and the encapsulation layer 246 are positioned on the second electrode layer 332 in order to protect the organic layer 324 from external moisture or oxygen. This consequently increases the number of process steps as well as manufacturing costs due to additional processing such as deposition, which are problematic.

In contrast, in the OLED display panel 140 according to this embodiment, the second electrode layer 332 and the encapsulation layer 334 are simultaneously formed through hydrogen plasma treatment of the multilayer thin film 330 that has been transferred after being formed outside, thereby minimizing the number of process steps and reducing the time required for processing.

In addition, the thickness of one layer of the multilayer thin film 330 is, for example, about 3 Å. Since thickness of one hundred layers of the multilayer thin film 330 is merely 300 Å, the multilayer thin film 330 may have a very small thickness. Consequently, the multilayer thin film 330 has a high transmittance of light emitted from the organic layer 324.

In addition, it is possible to adjust transmittance by adjusting the number of layers or adjusting the time required for plasma treatment, the frequency of oscillation, or the like. It is advantageously possible to change the thickness of the second electrode layer 332 and the thickness of the encapsulation layer 334 depending on the value of design. For example, when the OLED display device 100 is a top emission type, a high level of light transmittance is required. In this case, it is possible to realize a high level of light transmittance by reducing the number of layers. In addition, in the OLED display device 100, it is possible to realize a high level of brightness by increasing the thickness of the layer 332 without the interlayer bonding 350 or realize high moisture impermeability by increasing the thickness of the layer 334 having the interlayer bonding 350.

Furthermore, since the multilayer thin film 330 formed of graphene has superior mechanical flexibility due to the physical properties of graphene, the multilayer thin film 330 can be advantageously used in flexible displays.

Figure 5A:
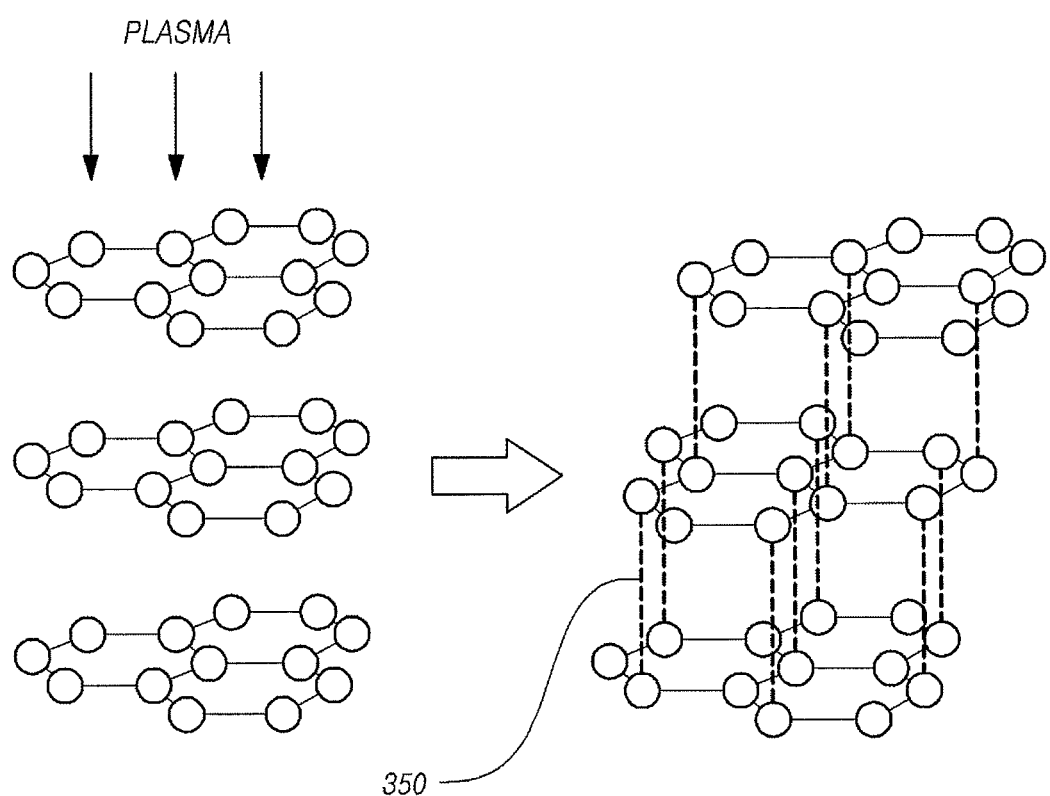
FIG. 5A and FIG. 5B are views illustrating structural changes in a multilayer thin film according to plasma treatment.
Figure 5B:
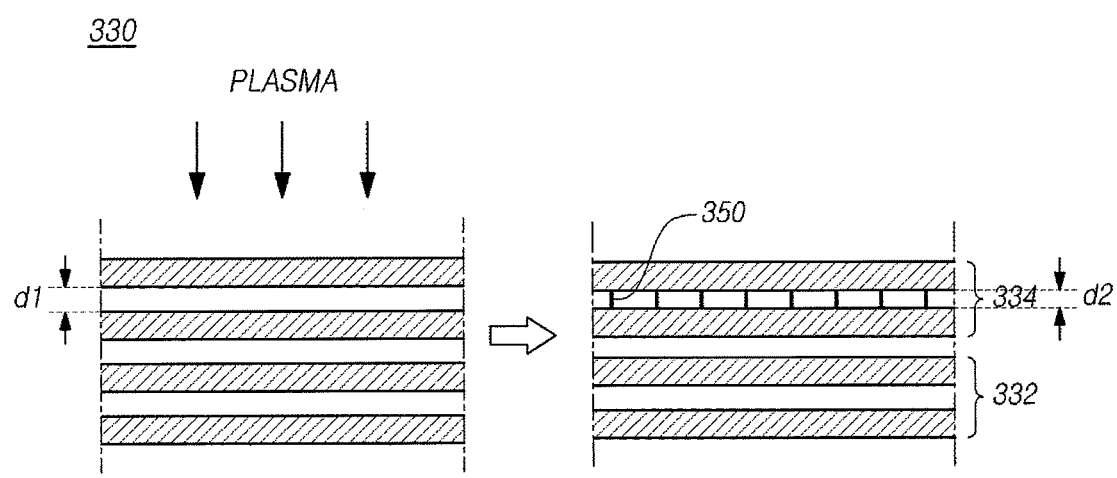

FIG. 5A and FIG. 5B are views illustrating structural changes in a multilayer thin film according to plasma treatment.

Referring to FIG. 5A and FIG. 5B, when the multilayer thin film 330 without the interlayer bonding 350 is subjected to plasma treatment, a change in structure occurs.

Before the plasma treatment, carbon atoms of graphene have $sp^2$ conjugates. The stacked layers of the multilayer thin film 330 are combined by Van der Waals force and pi ($\pi$) bonds that are caused by instantaneously-induced charges.

In contrast, after the plasma treatment has been completed, the interlayer bonding 350 may be formed in a localized area or the entire area of the upper layers of the multilayer thin film 330. The interlayer bonding 350 forms an $sp^3$ bond (or a diamond-like structure). This bond corresponds to a covalent bond that is a direct bond between atoms, caused by a stronger force than the Van der Waals interaction.

Therefore, the interlayer distance d2 of the layers of the encapsulation layer 334, i.e. the layers 334 having the interlayer bonding 350 formed by plasma treatment, is smaller than the interlayer distance d1 of the layers of the second electrode layer 332.

Figure 6A:
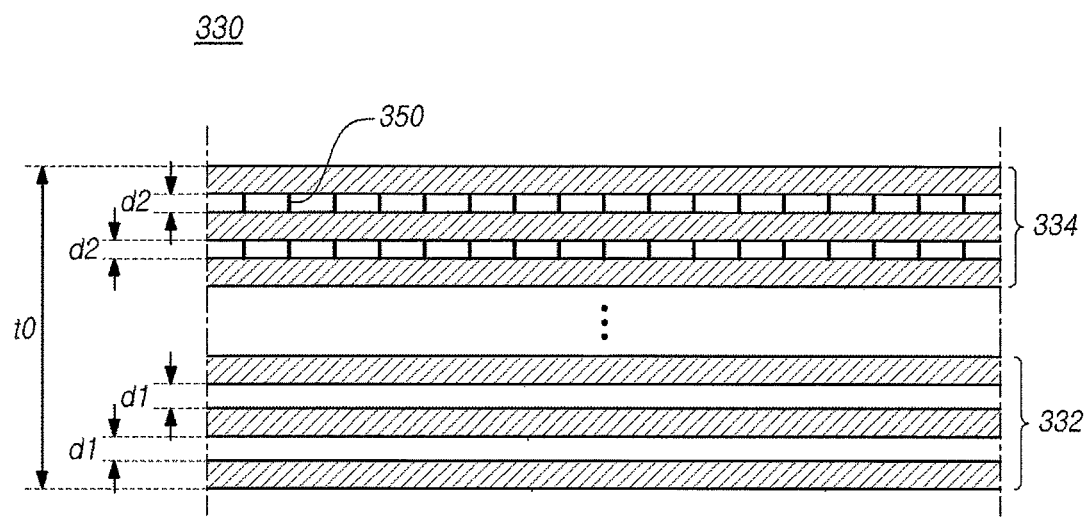
FIG. 6A to FIG. 6D are schematic cross-sectional views illustrating implementations of a multilayer thin film of an OLED display device according to another exemplary embodiment of the present disclosure.
Figure 6B:
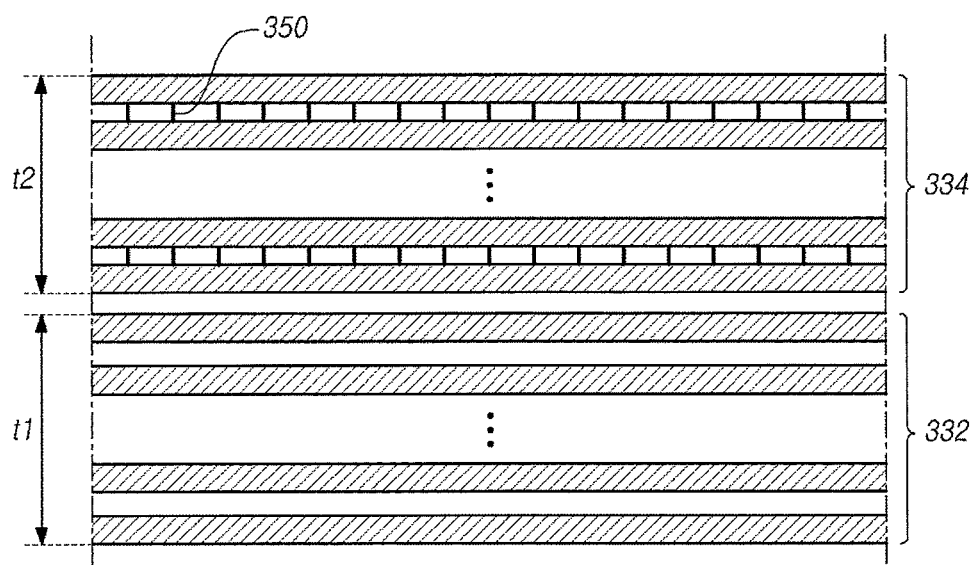

FIG. 6A and FIG. 6B are schematic cross-sectional views illustrating implementations of a multilayer thin film of an OLED display device according to a further exemplary embodiment of the present disclosure.

Referring to FIG. 6A and FIG. 6B, the multilayer thin film 330 includes the encapsulation layer 334 having the interlayer bonding 350 and the second electrode layer 332 without the interlayer bonding 350.

The entire thickness t0 of the multilayer thin film 330 may vary depending on the design values of products. In other words, the number of the layers of the multilayer thin film 330 may vary depending on the design value of at least one selected from among, but not limited to, light transmittance, sheet resistance, brightness, electrical conductivity, and moisture permeability, and accordingly, the entire thickness t0 is determined.

The encapsulation layer 334 may be formed of two or more layers, in which the interlayer distance d2 thereof is smaller than the interlayer distance d1 of the layers of the second electrode layer 332, and the interlayer bonding 350 is present in each of adjacent layers thereof.

The thickness t2 of the encapsulation layer 334 may vary depending on the design values. For example, the thickness t2 is increased in order to realize high moisture impermeability, whereas the thickness t2 is reduced when high light transmittance is required. These features can be realized by adjusting the number of layers.

Likewise, the second electrode layer 332 may be formed of two or more layers, with the interlayer distance d1 thereof being greater than the interlayer distance d2 of the encapsulation layer 334.

The thickness t1 of the second electrode layer 332 may be thick, for example when low sheet resistance and high electrical conductivity are required, or may be thin when high light transmittance is required.

Figure 6C:
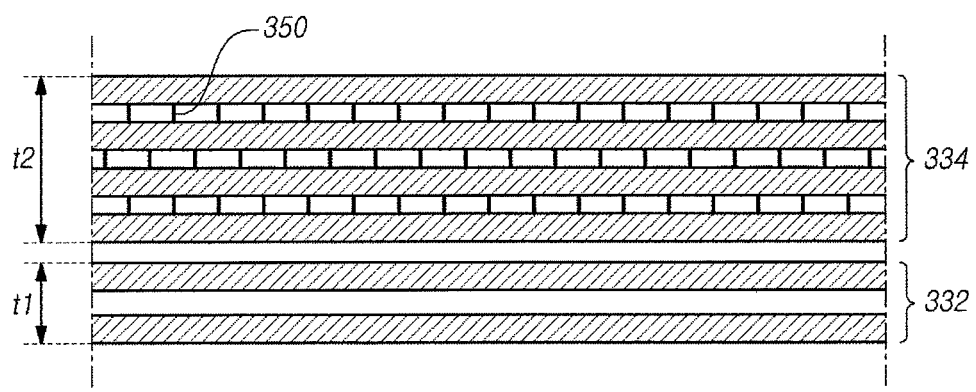
Figure 6D:
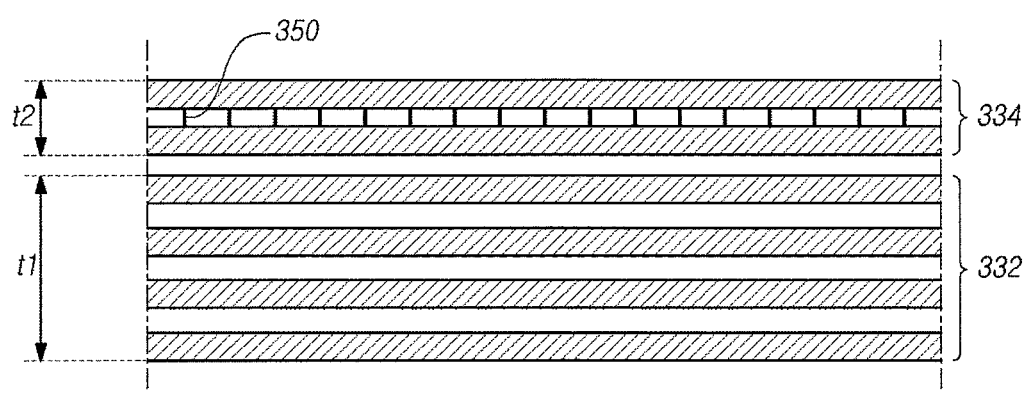

As illustrated in FIG. 6C and FIG. 6D, in the structure of the multilayer thin film 330, the thickness t2 of the encapsulation layer 334 and the thickness t1 of the second electrode layer 332 may relatively vary. Specifically, in FIG. 6C, the encapsulation layer 334 includes four layers, whereas the second electrode layer 332 include two layers (t2>t1). In addition, in the case of FIG. 6D, the encapsulation layer 334 include two layers, whereas the second electrode layer 332 includes four layers (t2<t1). These features may vary depending on design values as required.

The structure of the OLED display panel 140 or the OLED display device 100 including the multilayer thin film 330 has been described hereinabove. In the following, a detailed description will be given of a method of fabricating the OLED display panel 140 including the multilayer thin film 330.

FIG. 7A to FIG. 7F are process views illustrating a method of fabricating an OLED display panel according to further another embodiment of the present disclosure. Descriptions of some features will be omitted since they are identical to those described in FIG. 1 to FIG. 6D.

Referring to FIG. 7A to FIG. 7F, the method of fabricating the OLED display panel 140 includes: forming an organic layer 324 on a first electrode 320; forming a multilayer thin film 330 formed of graphene on the organic layer 324; and forming interlayer bonding 350 between two or more upper layers of the multilayer thin film 330 by plasma treatment, with the layers without the interlayer bonding forming a second electrode layer (or common electrode layer) 332, and the two or more layers having the interlayer bonding forming an encapsulation layer 334.

Here, the interlayer bonding 350 may be an $sp^3$ bond of carbon atoms of two adjacent layers or a diamond-like structure.

Figure 7A:
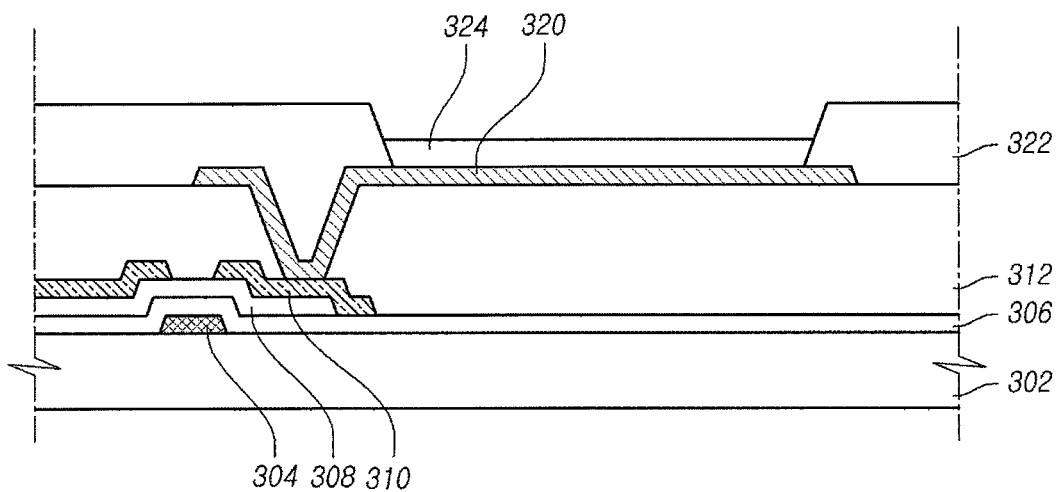
FIG. 7A to FIG. 7F are process views illustrating a method of fabricating an OLED display panel according to further another exemplary embodiment of the present disclosure.

Specifically, as illustrated in FIG. 7A, after a substrate 302, a transistor, a gate insulation film 306, a planarization layer 312, and the first electrode 320 of the OLED display panel 140 are formed, the operation of forming the bank 322 and the organic layer 324 is performed.

The transistor including a gate electrode 304, the gate insulating film 306, a semiconductor layer 308, and a source electrode/drain electrode 310 is deposited by a deposition process, such as physical vapor deposition or chemical vapor deposition, and is patterned by an etching process.

The transistor has a planarization layer 312 formed thereon in which a contact hole formed by deposition is positioned. The first electrode 320 is deposited and patterned on the planarization layer 312 such that the first electrode 320 is connected to the source electrode/drain electrode 310 via the contact hole.

The bank 322 is formed along the circumference of the first electrode. The bank 322 may be formed of an inorganic material by deposition and etching processes, or may be formed of an organic material by a solution process.

The organic layer 324 is formed on the first electrode 320 exposed by the bank 322. The organic layer 324 may include a plurality of layers. The organic layer 324 may be deposited by physical vapor deposition or chemical vapor deposition, or may be formed by a solution process, such as inkjet printing. When the solution process is used, only some of the plurality of layers may be formed by the solution process.

The multilayer thin film 330 may be formed on the first electrode 320. An implementation of the method of fabricating the multilayer thin film 330 is illustrated in FIG. 7B to FIG. 7D.

Figure 7B:
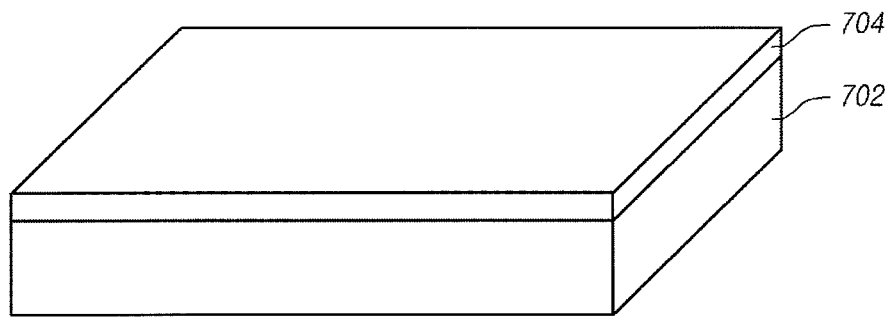
Figure 7C:
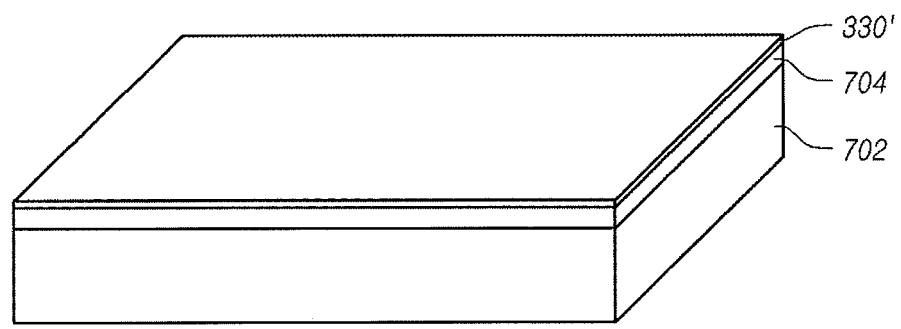
Figure 7D:
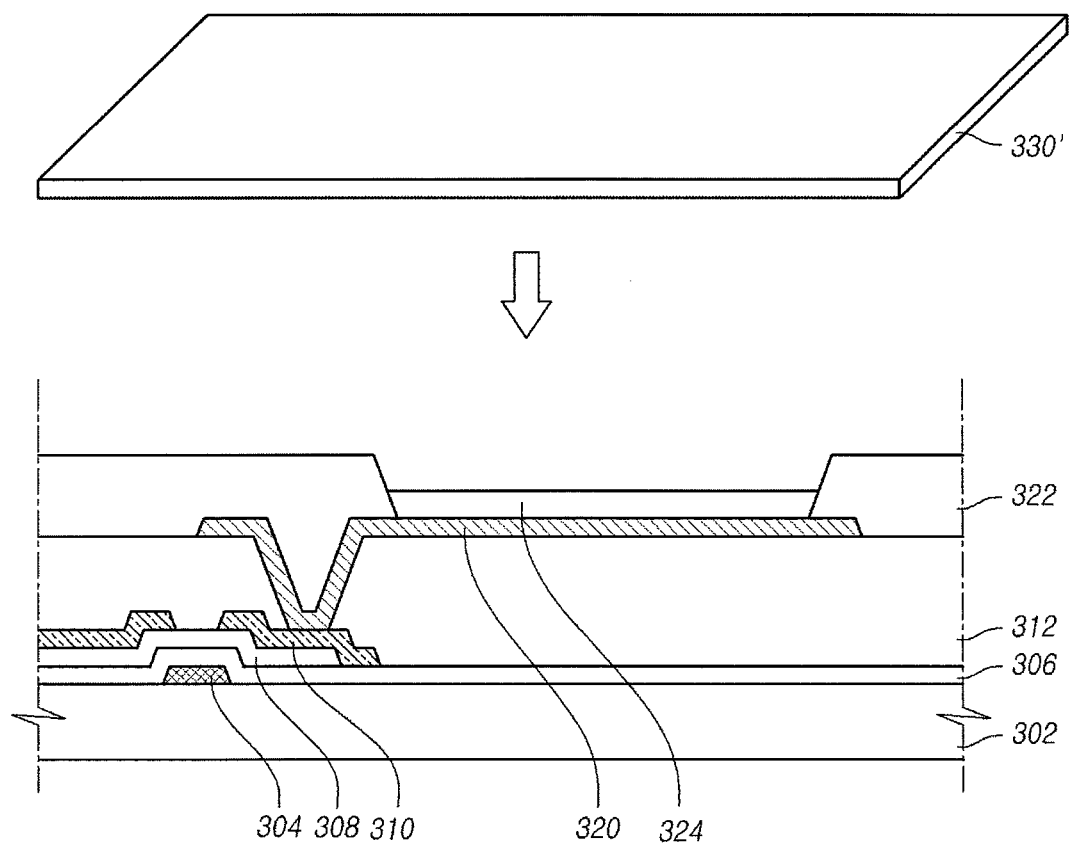

The method of fabricating the multilayer thin film 330 illustrated in FIG. 7B to FIG. 7D is an implementation of the fabrication method using chemical vapor deposition, but the method of fabricating the OLED display panel 140 according to the present disclosure is not limited thereto.

The operation of forming the multilayer thin film 330 includes growing a multilayer of graphene on a catalyst metal layer 704 and subsequently transferring the multilayer of graphene to the organic layer 324 of the OLED display panel 140, thereby forming the multilayer thin film 330.

Specifically, the catalyst metal layer 704 is formed on a base substrate 702. The catalyst metal layer 704 may be formed of a low carbon solubility material, such as Cu or Ni, but the present disclosure is not limited thereto.

Thereafter, graphene is grown on the catalyst metal layer 704 by chemical vapor deposition. Deposition of graphene is performed several times to form a multilayer film 330' having a multiplicity of layers before the multilayer film 330' is transferred, and a transparent adhesive film to which the organic layer 324 is to be adhered may be positioned on the multilayer film 330'.

Figure 7E:
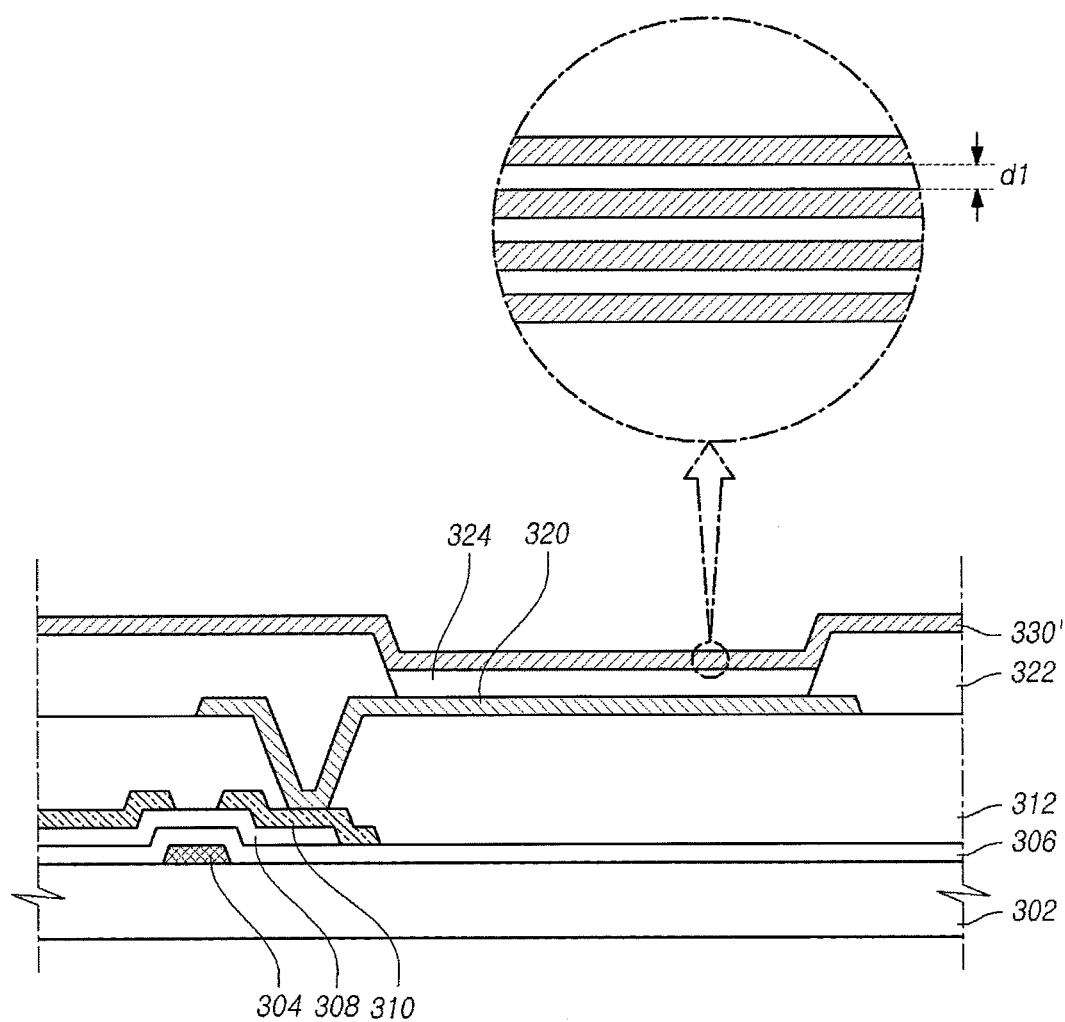

Afterwards, the catalyst metal layer 704 is etched off using a selective etching solution, and the remaining multilayer film 330' is transferred to the organic layer 324. Consequently, the operation of forming the multilayer thin film 330 illustrated in FIG. 7E is performed.

It should be understood that the method of fabricating the multilayer thin film 330 using chemical vapor deposition has been disclosed for illustrative purposes only, and that the multilayer thin film 330 of the OLED display panel 140 according to embodiments of the present disclosure may be embodied in a variety of other forms.

For example, the multilayer thin film 330 may be formed of reduced graphene oxide (rGO) that is produced by forming graphene oxide (GO) by oxidizing graphene with a strong oxidizer such as potassium permanganate ($KMnO_4$) and subsequently reducing the graphene oxide (GO) with a reducer such as hydrazine ($NH_2NH_2$).

The operation of forming the multilayer thin film 330 may form the multilayer thin film 330 by adjusting the number of layers depending on at least one design value which can be selected from among, but is not limited to, light transmittance, sheet resistance, electrical conductivity, and moisture permeability.

For example, when the thickness t0 of the multilayer thin film 330 is increased by forming the multilayer thin film 330 of a greater number of layers, and the thickness t2 of the encapsulation layer 334 having the interlayer bonding 350 is also increased, the encapsulation layer 334 has the following characteristics, such as reduced light transmittance, increased sheet resistance, reduced electrical conductivity, and reduced moisture permeability (improved moisture permeability characteristics).

In contrast, when the thickness t0 of the multilayer thin film 330 is reduced by forming the multilayer thin film 330 of a smaller number of layers, and the thickness t1 of the second electrode layer 332 without the interlayer bonding 350 is also decreased, the second electrode layer 332 has the following characteristics, such as increased light transmittance, low sheet resistance, increased electrical conductivity, and increased moisture permeability.

After that, the operation of forming the second electrode layer 332 and the encapsulation layer 334 is performed by forming the interlayer bonding 350 by plasma treatment.

As illustrated in FIG. 7E, the multilayer film 330' that has not experienced plasma treatment has no interlayer bonding 350 formed between layers. Here, the interlayer distance d1 is relatively wide since the layers are combined by relatively weak interaction.

Figure 7F:
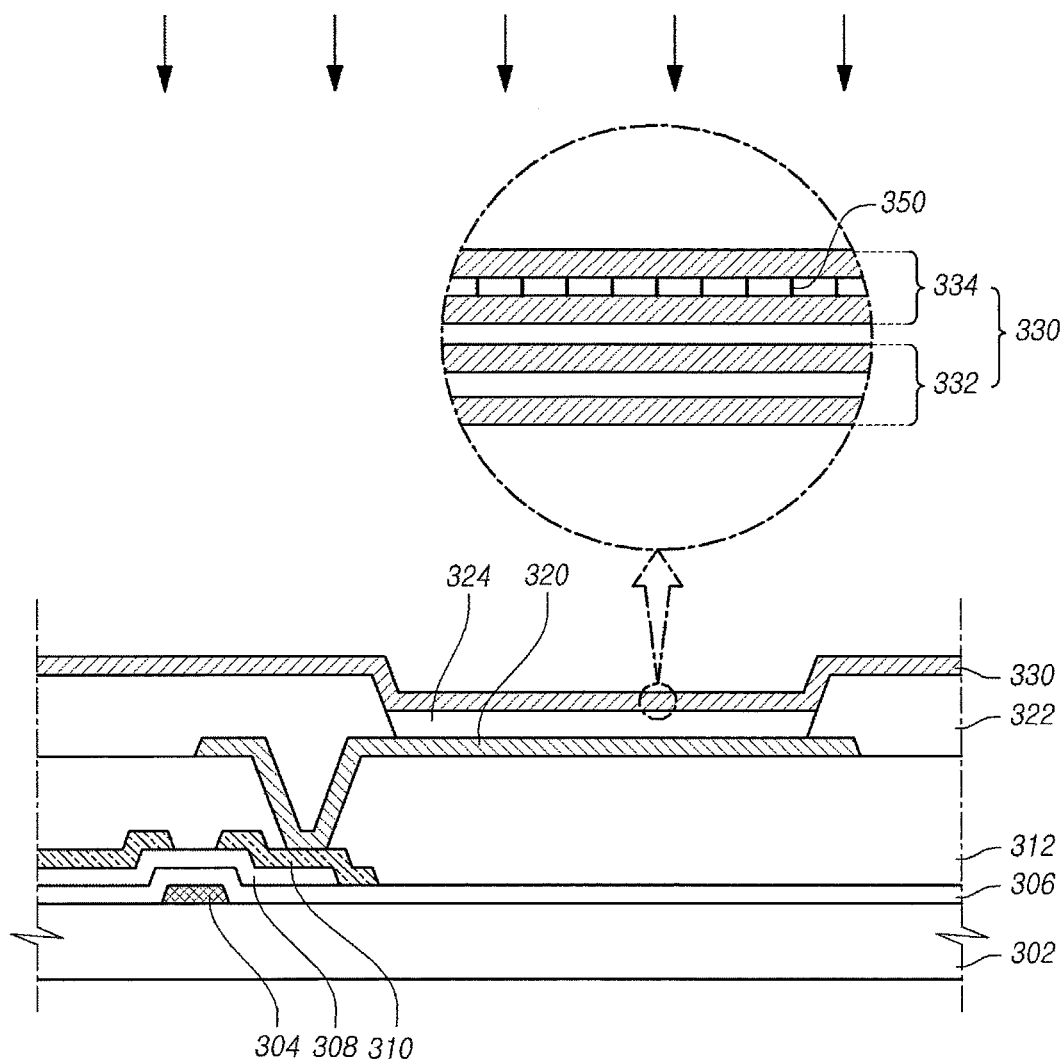

In contrast, as illustrated in FIG. 7F, when plasma treatment is performed, a multilayer thin film 330 having the interlayer bonding 350 is formed. Here, the plasma may be hydrogen plasma.

The operation of performing a plasma treatment may include positioning a panel 140 within a chamber evacuated, for example, by a vacuum pump, and subsequently exposing the multilayer thin film 330 to a hydrogen plasma generated by a high-frequency generator under conditions of 1 mbar pressure and 20 W power.

Here, the time, pressure and temperature required for plasma processing and the frequency of plasma are variable. For example, the operation of forming the second electrode layer 332 and the encapsulation layer 334 can determine the thickness t1 of the second electrode layer 332 and the thickness t2 of the encapsulation layer 334 by adjusting at least one of the pressure, temperature, time and frequency of plasma.

Specifically, the thickness t2 of the encapsulation layer 334 is increased as the time required for plasma treatment, the pressure, the temperature, and the frequency of plasma are increased. Accordingly, the encapsulation layer 334 has the following characteristics, such as improved moisture permeability characteristics, reduced light transmittance, reduced electrical conductivity, and increased sheet resistance.

When the time required for plasma processing is reduced, pressure or temperature is lowered, or the frequency of plasma is reduced, the thickness t2 of the encapsulation layer 334 is relatively decreased and the thickness t1 of the second electrode layer 332 is relatively increased. Consequently, the second electrode layer 332 has low sheet resistance and improved electrical conductivity characteristics.

Through these adjustment processes, the second electrode layer 332 and the encapsulation layer 334 are formed, thereby completing the fabrication of the OLED display panel 140.

Figure 8A:
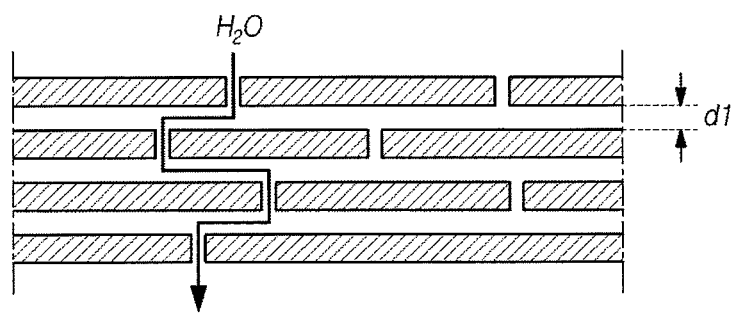
FIG. 8A is a schematic cross-sectional view illustrating moisture permeation when the multilayer film of the OLED display device has no interlayer bonding.
Figure 8B:
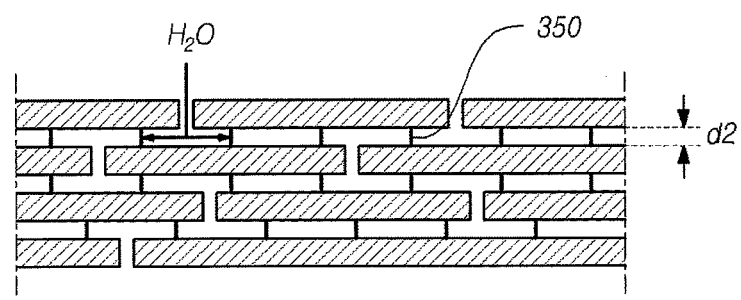
FIG. 8B is a schematic cross-sectional view illustrating a path of moisture when the multilayer film of the OLED display device according to embodiments of the present disclosure has interlayer bonding.

FIG. 8A is a schematic cross-sectional view illustrating moisture permeation when the multilayer film of the OLED display device has no interlayer bonding, and FIG. 8B is a schematic cross-sectional view illustrating a path of moisture when the multilayer film of the OLED display device has interlayer bonding 350.

Referring to FIG. 8A and FIG. 8B, the multilayer thin film 330 of the OLED display panel 140 may contain intrinsic defects.

For example, as illustrated in FIG. 7B to FIG. 7D, when the multilayer thin film 330 is formed by chemical vapor deposition, the multilayer thin film 330 may be deposited on the catalyst metal layer 704. Here, the catalyst metal layer 704 includes contiguous regions having different crystal patterns. Consequently, the graphene deposited on the catalyst metal layer 704 contains a plurality of domains. The domains refer to the crystal plane areas of polycrystalline graphene. Due to these domains, each layer of the multilayer thin film 330 may include a plurality of defects.

In addition, reduced graphene oxide (rGO) produced by reducing graphene oxide (GO) may also contain a variety of detects introduced through strong oxidation during the fabrication of graphene oxide (GO).

The defects within the multilayer thin film 330 of the OLED display panel 140 may cause a problem of moisture ($H_2O$) or oxygen ($O_2$) permeation into the OLED display panel 140. The organic layer 324 of the OLED display panel 140 may suffer from deteriorating electrical characteristics and reduced life when moisture or oxygen permeates from the outside, since the organic layer 324 is formed of an organic material.

In contrast, in the encapsulation layer 334 of the OLED display panel 140 according to embodiments of the present disclosure, the interlayer bonding 350 can prevent moisture or oxygen from permeating from the outside.

Consequently, in the multilayer thin film 330, the encapsulation layer 334 having the interlayer bonding 350 can prevent moisture or oxygen from permeating from the outside, prevent the organic layer from deteriorating in characteristics, and improve the reliability and longevity of the OLED display panel 140.

Accordingly, the OLED display panel 140 and the OLED display device 100 according to embodiments of the present disclosure are formed of graphene, and include the multilayer thin film 330 having the interlayer bonding 350 in the upper layers.

In the multilayer thin film 330, the second electrode layer 332 without the interlayer bonding 350 has high electrical conductivity and low sheet resistance.

In addition, in the multilayer thin film 330, the encapsulation layer 334 having the interlayer bonding 350 has improved moisture permeability characteristics able to prevent moisture and oxygen from permeating from the outside.

Furthermore, the multilayer thin film 330 has a high level of light transmittance due to the very small thickness t0. In addition, superior strength and mechanical flexibility can be obtained due to the physical properties of graphene. In the OLED display panel 140 and the OLED display device 100 of the top emission type, in which light is emitted from the organic layer 324 in a direction toward the multilayer thin film 330, light transmittance may be a key factor. In addition, when the OLED display panel 140 and the OLED display device 100 are flexible display devices, mechanical flexibility is important.

In addition, it is advantageously possible to adjust the thickness t0 by adjusting the number of layers of the multilayer thin film 330 depending on the design values required for the OLED display panel 140 and the OLED display device 100, and adjust the thickness t1 of the second electrode layer 332 and the thickness t2 of the encapsulation layer 334 by changing the conditions required for plasma processing.

Finally, the OLED display panel 140 and the OLED display device 100 according to embodiments of the present disclosure have advantageous characteristics, such as the reduced number of process steps, the reduced time required for processing, and reduced manufacturing costs, since the second electrode layer 332 and the encapsulation layer 334 are simultaneously formed.

While the embodiments of the present disclosure have been described in conjunction with the drawings, the present disclosure is by no means limited thereto.

Although various embodiments have been described up to now with reference to the accompanying drawings, the present invention is not limited to thereto.

As to one embodiment, an organic light-emitting diode display panel may comprise an organic layer positioned on a first electrode; and a multilayer thin film positioned on the organic layer, the multilayer thin film being formed of a stack of graphene, wherein the multilayer thin film has an interlayer bonding between two or more upper layers thereof.

The interlayer bonding may comprise an $sp^3$ bond of carbon atoms of adjacent two layers.

The interlayer bonding may comprise a diamond-like structure of carbon atoms of adjacent two layers.

The two or more layers having the interlayer bonding may comprise an encapsulation layer, and layers of the multilayer thin film without the interlayer bonding comprise a second electrode.

The two or more layers having the interlayer bonding may be bonded by a covalent bond, and layers of the multilayer thin film without the interlayer bonding interact by Van der Waals force.

A sheet resistance of the two or more layers having the interlayer bonding may be greater than a sheet resistance of layers of the multilayer thin film without the interlayer bonding.

An electrical conductivity of the two or more layers having the interlayer bonding may be smaller than an electrical conductivity of layers of the multilayer thin film without the interlayer bonding.

An interlayer distance of the two or more layers having the interlayer bonding may be smaller than an interlayer distance of layers of the multilayer thin film without the interlayer bonding.

A moisture permeability of the two or more layers having the interlayer bonding may be smaller than a moisture permeability of layers of the multilayer thin film without the interlayer bonding.

An increase in a thickness of layers of the multilayer thin film without the interlayer bonding may increase a brightness of the organic light-emitting diode display panel at an equal driving voltage applied.

Light emitted from the organic layer may be radiated in a direction toward the multilayer thin film.

As to other embodiment, a method of fabricating an organic light-emitting diode display panel may comprise forming an organic layer on a first electrode; forming a multilayer thin film formed of graphene on the organic layer; and forming an interlayer bonding between two or more upper layers of the multilayer thin film by plasma treatment, with layers without the interlayer bonding forming a second electrode, and the two or more layers having the interlayer bonding forming an encapsulation layer.

The forming the multilayer thin film may include adjusting a number of layers of the multilayer thin film depending on a design value of at least one selected from among the group consisting of light transmittance, sheet resistance, electrical conductivity, and moisture permeability.

The forming the second electrode and the encapsulation layer may include determining a thickness of the second electrode and a thickness of the encapsulation layer by adjusting at least one selected from the group consisting of pressure, temperature, time, and frequency of plasma in the plasma treatment.

The plasma may include a hydrogen plasma.

The forming the multilayer thin film may include growing a multilayer of the graphene on a catalyst metal layer and subsequently transferring the multilayer of the graphene to the organic layer.

It will be understood that the terms "comprise," "include," "have," "contain," and any variations thereof used herein are intended to cover a non-exclusive inclusion unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the present disclosure relates can make many modifications and variations without departing from the principle of the disclosure. The foregoing embodiments disclosed herein shall be interpreted as illustrative only not as limitative of the principle and scope of the disclosure. It should be understood that the scope of the invention shall be defined by the appended Claims and all of their equivalents fall within the scope of the disclosure.

What is claimed is:

1. An organic light-emitting diode display panel comprising:
    a first electrode;
    an organic layer on the first electrode; and
    a multilayer thin film on the organic layer, the multilayer thin film including first graphene layers for protecting the organic layer and second graphene layers for functioning as a second electrode,
    wherein the first graphene layers including interlayer bonds have a first sheet resistance, and the second graphene layers including no interlayer bonds have a second sheet resistance lower than the first sheet resistance, and
    wherein the interlayer bond corresponds to a direct bond between carbon atoms of two adjacent graphene layers.

2. The panel of claim 1, wherein an electrical conductivity of the second graphene layers is lower than that of the first graphene layers.

3. The panel of claim 1, wherein the second graphene layers are positioned between the organic layer and the first graphene layers.

4. The panel of claim 1, wherein the first graphene layers include a graphene layer of the multilayer thin film that is the furthest graphene layer from the organic layer.

5. The panel of claim 1, wherein the interlayer bond includes an sp3 bond of carbon atoms.

6. The panel of claim 1, wherein the interlayer bond is formed in a localized area of the first graphene layers.

7. The panel of claim 1, wherein the interlayer bond corresponds to a covalent bond between carbon atoms of two adjacent graphene layers.

8. The panel of claim 1, wherein a moisture permeability of the first graphene layers is smaller than a moisture permeability of the second graphene layers.

9. The panel of claim 1, wherein a light emitted from the organic layer is radiated in a direction toward the multilayer thin film.

10. A method of fabricating an organic light-emitting diode display panel, the method comprising:
    forming a first electrode;
    forming an organic layer on the first electrode;
    forming a multilayer thin film on the organic layer, the multilayer thin film including first graphene layers for protecting the organic layer and second graphene layers for functioning as a second electrode; and
    forming interlayer bonds between the first graphene layers,
    wherein the first graphene layers including the interlayer bonds have a first sheet resistance, and the second graphene layers including no interlayer bonds have a second sheet resistance lower than the first sheet resistance, and
    wherein the interlayer bond corresponds to a direct bond between carbon atoms of two adjacent graphene layers.

11. The method of claim 10, wherein the forming the interlayer bonds includes using a plasma treatment.

12. The method of claim 11, wherein a plasma in the plasma treatment includes a hydrogen plasma.

13. The method of claim 10, wherein the second graphene layers are positioned between the organic layer and the first graphene layers.

14. The method of claim 10, wherein the forming the multilayer thin film includes determining a number of graphene layers of the multilayer thin film depending on a design value selected from at least one of light transmittance, sheet resistance, electrical conductivity, and moisture permeability.

15. The method of claim 10, wherein the forming the multilayer thin film includes growing a multilayer thin film of graphene on a catalyst metal layer and subsequently transferring the multilayer thin film to the organic layer.

16. An organic light-emitting diode display panel comprising:

a first electrode;
a multilayer thin film; and
an organic layer positioned between the first electrode and the multilayer thin film,
wherein the multilayer thin film includes a plurality of first graphene layers and a plurality of second graphene layers,
wherein there is an interlayer bonding between the plurality of first graphene layers, and
wherein an interlayer distance of the plurality of first graphene layers is smaller than an interlayer distance of the plurality of second graphene layers.

* * * * *